(12) United States Patent
Berget et al.

(10) Patent No.: US 9,946,404 B1
(45) Date of Patent: Apr. 17, 2018

(54) LED SCREEN NOISE SENSING FOR DISCREET CAPACITIVE SENSORS

(71) Applicant: SYNAPTICS INCORPORATED, San Jose, CA (US)

(72) Inventors: Damien Berget, Sunnyvale, CA (US); Petr Shepelev, Campbell, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/476,040

(22) Filed: Mar. 31, 2017

(51) Int. Cl.
*G06F 3/044* (2006.01)
*G06F 3/041* (2006.01)
*H01L 27/32* (2006.01)

(52) U.S. Cl.
CPC ............ *G06F 3/0418* (2013.01); *G06F 3/044* (2013.01); *G06F 3/0412* (2013.01); *H01L 27/323* (2013.01)

(58) Field of Classification Search
USPC .................................................. 345/170–176
See application file for complete search history.

(56) References Cited

U.S. PATENT DOCUMENTS

| | | | |
|---|---|---|---|
| 2017/0269746 A1* | 9/2017 | He | G06F 3/0412 |
| 2017/0269748 A1* | 9/2017 | Ding | G06F 3/0412 |
| 2017/0285789 A1* | 10/2017 | Barel | G06F 3/0412 |
| 2017/0285790 A1* | 10/2017 | Barel | G06F 3/0412 |
| 2017/0293377 A1* | 10/2017 | Hsu | G06F 3/044 |
| 2017/0300165 A1* | 10/2017 | Shin | G06F 3/0416 |
| 2017/0308195 A1* | 10/2017 | Huang | G06F 3/044 |
| 2017/0344173 A1* | 11/2017 | Tang | G06F 3/0416 |
| 2017/0357363 A1* | 12/2017 | Yang | G06F 3/0416 |

* cited by examiner

*Primary Examiner* — Tony Davis
(74) *Attorney, Agent, or Firm* — Paradice and Li LLP

(57) ABSTRACT

Embodiments herein provide input devices that include an LED display panel on which a discreet capacitive sensor is disposed to form a capacitive sensing region. The capacitive sensor includes a plurality of sensor electrodes that are used to generate capacitive sensing signals indicating user interaction with the input device. In one embodiment, the sensor electrodes are disposed on a cathode layer in the LED display panel such that the sensor electrodes are capacitively coupled to the LED display panel. Currents in the cathode layer can cause interference or noise when performing capacitive sensing. The input devices include an analog front end channel for measuring interference resulting from the cathode layer at the same time receivers measure capacitive sensing signals using the sensor electrodes. The input device may process the capacitive sensing signals differently depending on the measured interference.

20 Claims, 10 Drawing Sheets

LED SCREEN NOISE SENSING FOR DISCREET CAPACITIVE SENSORS

FIELD OF THE INVENTION

Embodiments herein generally describe electronic devices and measuring interference caused by display components on a capacitive sensor.

BACKGROUND OF THE INVENTION

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

BRIEF SUMMARY OF THE INVENTION

One embodiment described herein is an input device that includes a light emitting diode (LED) display that includes a transparent conductive layer that is a cathode layer or an anode layer. The input device also includes a plurality of sensor electrodes disposed on the LED display where the plurality of sensor electrodes establishes a sensing region of the input device. The input device also includes a processing system configured to determine, using a first receiver, a capacitive sensing signal generated using at least one of the plurality of sensor electrodes, determine, using a second receiver, interference generated by the LED display in parallel with determining the capacitive sensing signal using the first receiver where the second receiver is electrically coupled to the transparent conductive layer in the LED display, and process the capacitive sensing signal in response to the determined interference.

Another embodiment described herein is a processing system that includes a first receiver configured to couple to a first sensor electrode of a plurality of sensor electrodes establishing a sensing region of an input device where the first receiver is configured to determine a capacitive sensing signal generated using the first sensor electrode. The processing system includes a second receiver configured to electrically couple to a transparent conductive layer in an LED display where the plurality of sensor electrodes are disposed on the LED display and where the second receiver is configured to determine interference generated by the LED display using the transparent conductive layer in parallel with determining the capacitive sensing signal using the first receiver.

Another embodiment described herein is a method that includes determining, using a first receiver, a capacitive sensing signal generated using a first sensor electrode of a plurality of sensor electrodes where the plurality of sensor electrodes establishes a sensing region of an input device and determining, using a second receiver, interference generated by an LED display in parallel with determining the capacitive sensing signal using the first receiver where the plurality of sensor electrodes is disposed on the LED display and where the second receiver is electrically coupled to a transparent conductive layer in the LED display. The method also includes processing the capacitive sensing signal in response to the determined interference.

BRIEF DESCRIPTION OF DRAWINGS

So that the manner in which the above recited features of the present invention can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
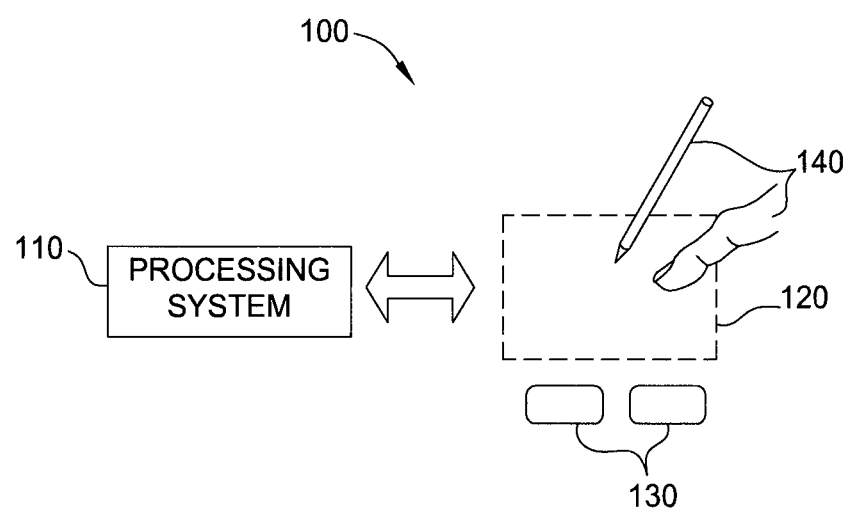
FIG. 1 is a block diagram of an exemplary system that includes an input device in accordance with an embodiment of this disclosure.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or its application and uses. Furthermore, there is no intention to be bound by any expressed or implied theory presented in the preceding technical field, background, brief summary or the following detailed description.

Various embodiments of the present disclosure provide input devices and methods that facilitate improved usability. In one embodiment, the input devices include a light emitting diode (LED) display panel on which a discreet capacitive sensor is disposed to form a capacitive sensing region. The capacitive sensor includes a plurality of sensor electrodes that are used to generate capacitive sensing signals indicating user interaction with the input device. In one embodiment, the sensor electrodes are disposed on a cathode layer in the LED display panel such that the sensor electrodes are capacitively coupled to the LED display panel. Current flows through the cathode layer when the LED pixels are active (i.e., when current flows through corresponding LED diodes) which can cause interference or noise when using the sensor electrodes to perform capacitive sensing. In other embodiments, the LED pixels are coupled to an anode layer (instead of a cathode layer) which can cause interference or noise during capacitive sensing.

In embodiments herein, the input device includes an analog front end channel for measuring interference resulting from the cathode layer (or anode layer). For example, the input device may include an interference detector for measuring the interference or noise generated by the cathode or anode layer at the same time receivers are measuring capacitive sensing signals using the sensor electrodes. The input devices may process the capacitive sensing signals differently depending on the measured interference. For example, the input device may reject the capacitive sensing measurements if the interference exceeds a threshold, or the input device may use temporal or spatial filtering to mitigate the effects of the interference on the capacitive sensing measurements.

Turning now to the figures, FIG. 1 is a block diagram of an exemplary input device 100, in accordance with embodiments described herein. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Example communication protocols include I²C, SPI, PS/2, Universal Serial Bus (USB), Bluetooth®, RF, and IrDA protocols.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 may comprise one or more sensing elements for detecting user input. As several non-limiting examples, the input device 100 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes.

In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements pick up loop currents induced by a resonating coil or a pair of coils. Some combination of the magnitude, phase, and frequency of the currents may then be used to determine positional information.

In some capacitive implementations of the input device 100, voltage or current is applied to create an electric field. Nearby input objects 140 cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object 140. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object 140 near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may transmit transmitter signals that are modulated relative to a reference voltage (e.g., system ground). Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). The effect(s) may be the transmitter signal, a change in the transmitter signal caused by one or more input objects and/or environmental interference, or other such effects. Sensor electrodes may be dedicated transmitters or receivers, or may be configured to both transmit and receive. Measurements acquired using mutual capacitance sensing methods may be referred to as mutual capacitance measurements.

Further, the sensor electrodes may be of varying shapes and/or sizes. The same shapes and/or sizes of sensor electrodes may or may not be in the same groups. For example, in some embodiments, receiver electrodes may be of the same shapes and/or sizes while, in other embodiments, receiver electrodes may be varying shapes and/or sizes.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. For example, a processing system 110 for a mutual capacitance sensor device may comprise transmitter circuitry configured to transmit signals with transmitter sensor electrodes, and/or receiver circuitry configured to receive signals with receiver sensor electrodes). Further, a processing system for an absolute capacitance sensor device may include driver circuitry configured to drive absolute capacitance signals onto sensor electrodes, and/or receiver circuitry configured to receive signals with those sensor electrodes. In one or more embodiments, a processing system for a combined mutual and absolute capacitance sensor device may include any combination of the above described mutual and absolute capacitance circuitry. In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a mobile device such as a phone, and the processing system 110 may comprise circuits and firmware that are part of a main processor of the mobile device. In some embodiments, the processing system 110 is dedicated to implementing the input device 100. In other embodiments, the processing system 110 also performs other functions, such as operating display screens, driving haptic actuators/mechanisms (not shown), etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments described herein are described in the context of a fully functioning apparatus, the mechanisms of the present disclosure are capable of being distributed as a program product (e.g., software) in a variety of forms. For example, the mechanisms of the present disclosure may be implemented and distributed as a software program on information bearing media that are readable by electronic processors (e.g., non-transitory computer-readable and/or recordable/writable information bearing media readable by the processing system 110). Additionally, the embodiments of the present disclosure apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2A:
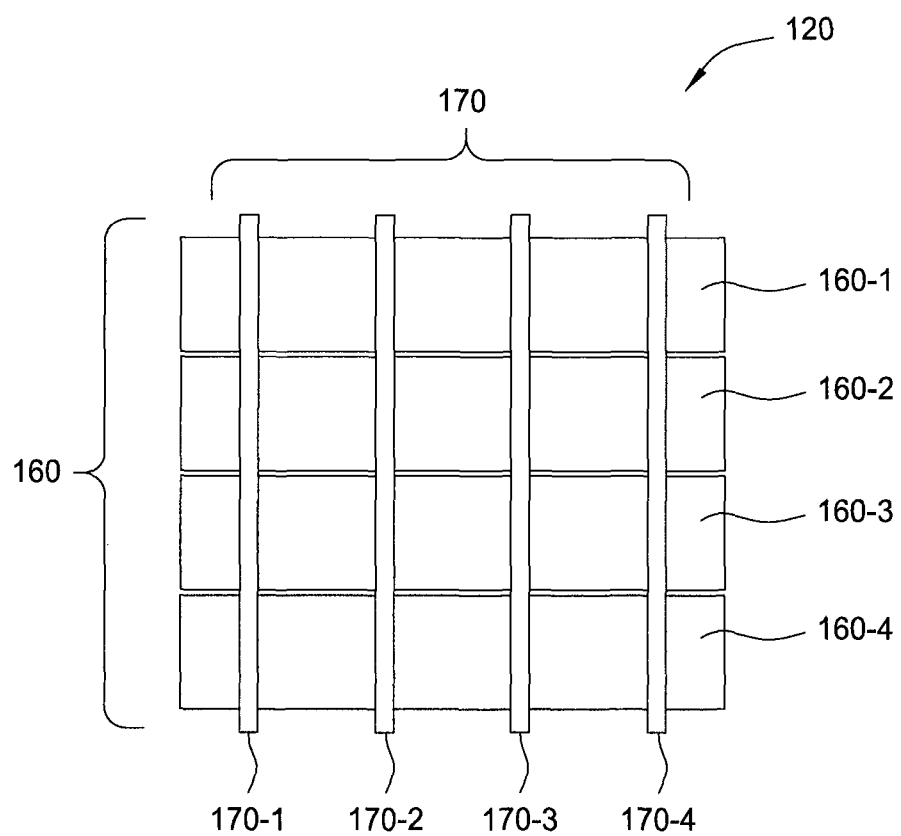
FIGS. 2A and 2B illustrate portions of exemplary patterns of sensing elements or capacitive sensing pixels, according to embodiments described herein.

FIG. 2A shows a portion of an exemplary pattern of sensing elements configured to sense in a sensing region 120 associated with the pattern, according to some embodiments. For clarity of illustration and description, FIG. 2A shows the sensing elements in a pattern of simple rectangles, and does not show various components. This pattern of sensing elements comprises a first plurality of sensor electrodes 160 (160-1, 160-2, 160-3, . . . 160-n), and a second plurality of sensor electrodes 170 (170-1, 170-2, 170-3, . . . 170-n) disposed over the first plurality of sensor electrodes 160. In one embodiment, this pattern of sensing elements comprises a plurality of transmitter electrodes 160 (160-1, 160-2, 160-3, . . . 160-n), and a plurality of receiver electrodes 170 (170-1, 170-2, 170-3, . . . 170-n) disposed over the plurality of transmitter electrodes 160. In another embodiment, the first plurality of sensor electrodes may be configured to transmit and receive and the second plurality of sensor electrodes may also be configured to transmit and receive.

Transmitter electrodes 160 and receiver electrodes 170 are typically ohmically isolated from each other. That is, one or more insulators separate transmitter electrodes 160 and receiver electrodes 170 and prevent them from electrically shorting each other. In some embodiments, transmitter electrodes 160 and receiver electrodes 170 are separated by insulative material disposed between them at cross-over areas; in such constructions, the transmitter electrodes 160 and/or receiver electrodes 170 may be formed with jumpers connecting different portions of the same electrode. In some embodiments, transmitter electrodes 160 and receiver electrodes 170 are separated by one or more layers of insulative material. In such embodiments, the transmitter electrodes and receiver electrodes may be disposed on separate layers of a common substrate. In some other embodiments, transmitter electrodes 160 and receiver electrodes 170 are separated by one or more substrates; for example, they may be disposed on opposite sides of the same substrate, or on different substrates that are laminated together.

The areas of localized capacitive coupling between transmitter electrodes 160 and receiver electrodes 170 may be termed "capacitive pixels." The capacitive coupling between the transmitter electrodes 160 and receiver electrodes 170 change with the proximity and motion of input objects in the sensing region associated with the transmitter electrodes 160 and receiver electrodes 170.

In some embodiments, the sensor pattern is "scanned" to determine these capacitive couplings. That is, the transmitter electrodes 160 are driven to transmit transmitter signals. One or more receiver sensor electrodes 170 may be operated to acquire resulting signals. The resulting signals may be used to determine measurements of the capacitive couplings at the capacitive pixels.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

The baseline capacitance of a sensor device is the capacitive image associated with no input object in the sensing region. The baseline capacitance changes with the environment and operating conditions, and may be estimated in various ways. For example, some embodiments take "baseline images" when no input object is determined to be in the sensing region, and use those baseline images as estimates of their baseline capacitances.

Capacitive images can be adjusted for the baseline capacitance of the sensor device for more efficient processing. Some embodiments accomplish this by "baselining" measurements of the capacitive couplings at the capacitive pixels to produce a "baselined capacitive image." That is, some embodiments compare the measurements forming a capacitance image with appropriate "baseline values" of a "baseline image" associated with those pixels, and determine changes from that baseline image.

Figure 2B:
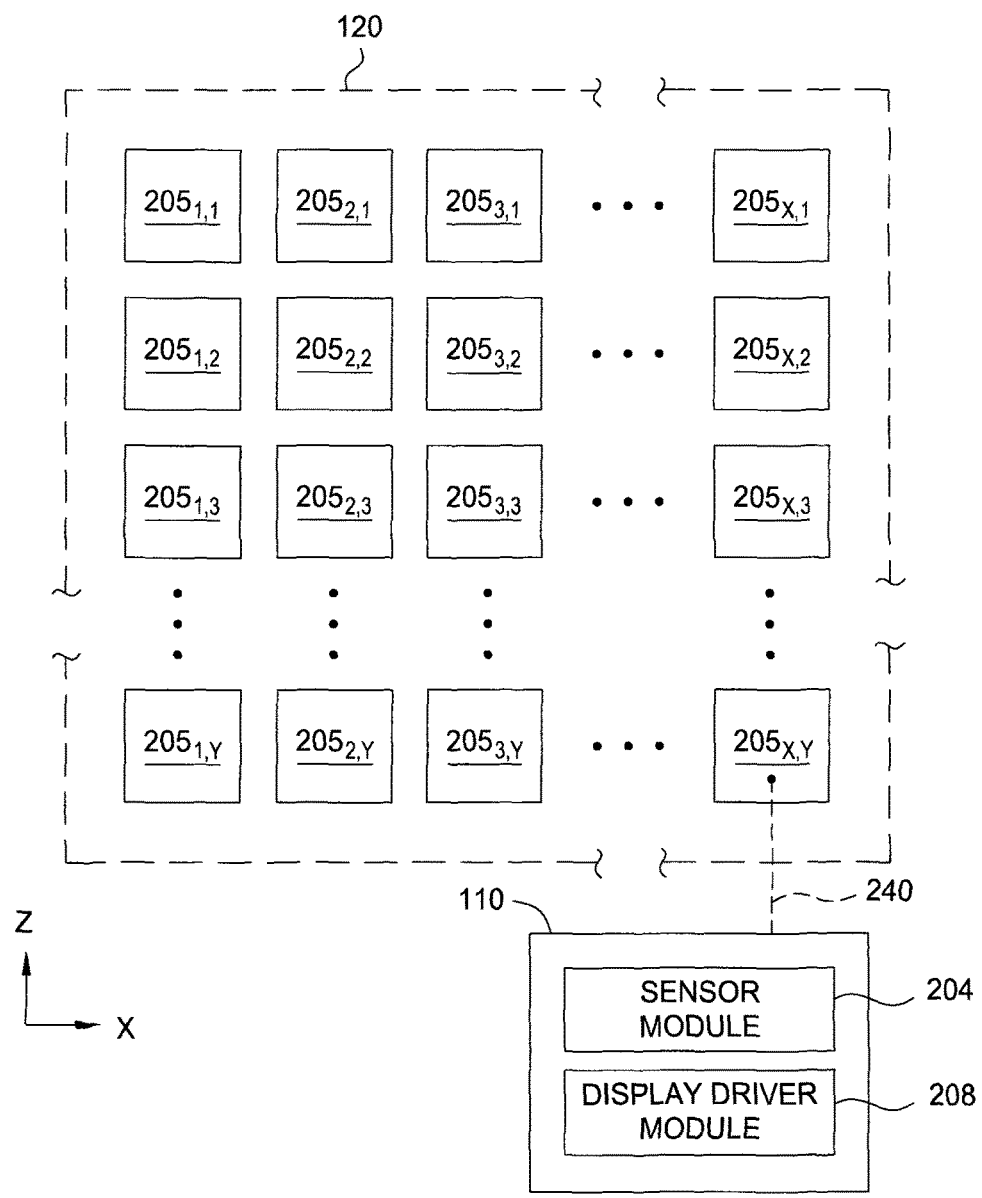

FIG. 2B shows a portion of an exemplary pattern of capacitive sensing pixels 205 (also referred to herein as capacitive pixels or sensing pixels) configured to sense in the sensing region 120 associated with a pattern, according to some embodiments. Each capacitive pixel 205 may include one of more of the sensing elements described above. For clarity of illustration and description, FIG. 2 presents the regions of the capacitive pixels 205 in a pattern of simple rectangles and does not show various other components within the capacitive pixels 205. In one embodiment, the capacitive sensing pixels 205 are areas of localized capacitance (capacitive coupling). Capacitive pixels 205 may be formed between an individual sensor electrode and ground in a first mode of operation and between groups of sensor electrodes used as transmitter and receiver electrodes in a second mode of operation. The capacitive coupling changes with the proximity and motion of input objects in the sensing region 120 associated with the capacitive pixels 205, and thus may be used as an indicator of the presence of the input object in the sensing region 120 of the input device.

The exemplary pattern comprises an array of capacitive sensing pixels 205X,Y (referred collectively as pixels 205) arranged in X columns and Y rows in a common plane, wherein X and Y are positive integers, although one of X and Y may be zero. It is contemplated that the pattern of sensing pixels 205 may comprises a plurality of sensing pixels 205 having other configurations, such as polar arrays, repeating patterns, non-repeating patterns, non-uniform arrays a single row or column, or other suitable arrangement. Further, as will be discussed in more detail below, the sensor electrodes in the sensing pixels 205 may be any shape such as circular, rectangular, diamond, star, square, noncovex, convex, nonconcave concave, etc. As shown here, the sensing pixels 205 are coupled to the processing system 110 and utilized to determine the presence (or lack thereof) of an input object in the sensing region 120.

In a first mode of operation, at least one sensor electrode within the capacitive sensing pixels 205 may be utilized to detect the presence of an input object via absolute sensing techniques. A sensor module 204 in processing system 110 is configured to drive a sensor electrode using a trace 240 in each pixel 205 with a modulated signal (i.e., a capacitive sensing signal) and measure a capacitance between the sensor electrode and the input object (e.g., free space or earth ground) based on the modulated signal, which is utilized by the processing system 110 or other processor to determine the position of the input object.

The various electrodes of capacitive pixels 205 are typically ohmically isolated from the electrodes of other capacitive pixels 205. Additionally, where a pixel 205 includes multiple electrodes, the electrodes may be ohmically isolated from each other. That is, one or more insulators separate the sensor electrodes and prevent them from electrically shorting to each other.

In a second mode of operation, sensor electrodes in the capacitive pixels 205 are utilized to detect the presence of an input object via transcapacitance sensing techniques. That is, processing system 110 may drive at least one sensor electrode in a pixel 205 with a transmitter signal and receive resulting signals using one or more of the other sensor electrodes in the pixel 205, where a resulting signal comprising effects corresponding to the transmitter signal. The resulting signal is utilized by the processing system 110 or other processor to determine the position of the input object.

The input device 100 may be configured to operate in any one of the modes described above. The input device 100 may also be configured to switch between any two or more of the modes described above.

In some embodiments, the capacitive pixels 205 are "scanned" to determine these capacitive couplings. That is, in one embodiment, one or more of the sensor electrodes are driven to transmit transmitter signals. Transmitters may be operated such that one transmitter electrode transmits at one time, or multiple transmitter electrodes transmit at the same time. Where multiple transmitter electrodes transmit simultaneously, the multiple transmitter electrodes may transmit the same transmitter signal and effectively produce an effectively larger transmitter electrode. Alternatively, the multiple transmitter electrodes may transmit different transmitter signals. For example, multiple transmitter electrodes may transmit different transmitter signals according to one or more coding schemes that enable their combined effects on the resulting signals of receiver electrodes to be independently determined.

One or more of the sensor electrodes configured as receiver sensor electrodes may be operated to acquire resulting signals. The resulting signals may be used to determine measurements of the capacitive couplings at the capacitive pixels 205.

A set of measurements from the capacitive pixels 205 form a capacitive image (also capacitive frame) representative of the capacitive couplings at the pixels 205 as discussed above. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

Continuing to refer to FIG. 2B, the processing system 110 coupled to the sensing electrodes includes a sensor module 204 and optionally, a display driver module 208. In one embodiment the sensor module 204 comprises circuitry configured to drive a transmitter signal or a modulated signal onto and receive resulting signals with the resulting signals the sensing electrodes during periods in which input sensing is desired. In one embodiment the sensor module 204 includes a transmitter module including circuitry configured to drive a transmitter signal onto the sensing electrodes during periods in which input sensing is desired.

In various embodiments the sensor module 204 may comprise a receiver module that includes circuitry configured to receive a resulting signal with the sensing electrodes comprising effects corresponding to the transmitter signal during periods in which input sensing is desired. The receiver module may determine a position of the input object in the sensing region 120 or may provide a signal including information indicative of the resulting signal to another module or processor, for example, a determination module or a processor of the electronic device (i.e., a host processor), for determining the position of the input object in the sensing region 120. In one or more embodiments, the receiver module comprises a plurality of receivers, where each receiver may be an analog front ends (AFEs).

The display driver module 208 includes circuitry confirmed to provide display image update information to the display of the display device during non-sensing (e.g., display updating) periods. The display driver module 208 may be included with or separate from the sensor module 204. In one embodiment, the processing system comprises a first integrated controller comprising the display driver module 208 and at least a portion of the sensor module 204 (i.e., transmitter module and/or receiver module). In another embodiment, the processing system comprises a first integrated controller comprising the display driver module 208 and a second integrated controller comprising the sensor module 204. In yet another embodiment, the processing system comprises a first integrated controller comprising a display driver module 208 and one of a transmitter module or a receiver module and a second integrated controller comprising the other one of the transmitter module and receiver module.

The discussion above regarding FIGS. 2A and 2B describes various sensor arrangements suitable for sensing along a single axis. However, the techniques described herein can be applied to any sensor arrangement suitable to collect data along a single axis such as the top, bottom or sides of the sensing region 120 or the arrangement of the sensor electrodes. Moreover, the embodiments herein can be used with either transcapacitive or absolute sensing techniques in order to identify gestures as an input object (e.g., a finger) moves along an axis.

Figure 3:
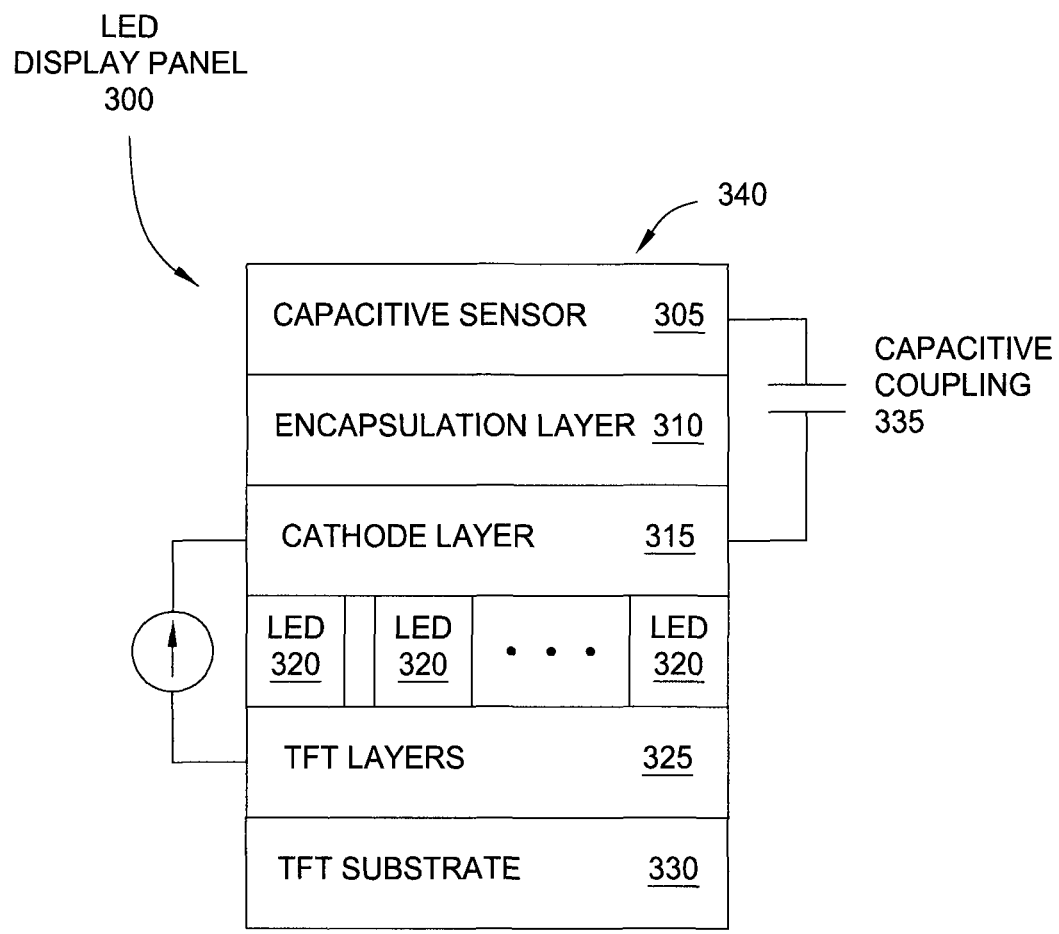
FIG. 3 illustrates a display panel with a cathode layer capacitively coupled to a capacitive sensor in accordance with an embodiment described herein.

FIG. 3 illustrates an LED display panel 300 with a cathode layer 315 capacitively coupled to a capacitive sensor 305 in accordance with an embodiment described herein. In this example, the LED display panel 300 includes an LED display that includes an encapsulation layer 310, the cathode layer 315, LEDs 320, thin-film-transistor (TFT) layers 325, and a TFT substrate 330. In one embodiment, the LED display panel 300 includes an organic LED (OLED) display. The encapsulation layer 310 can be made of any dielectric or nonconductive material that provides support to the display and is optically transparent so that the light emitted by the LEDs 320 can propagate therethrough.

In one embodiment, the cathode layer 315 is solid conductive sheet that is coupled to a low voltage rail (VSS) of the display. However, in other embodiments, the cathode layer 315 may be patterned to form individual electrodes—e.g., rectangles or other shapes that extend across the display panel 300. Like the encapsulation layer 310, the material in the cathode layer 315 is optically transparent, but unlike the encapsulation layer 310, the cathode layer 315 may be conductive so that current can flow in this layer. For example, the conductive material in the cathode layer 315 may be indium-tin oxide (ITO) or any other suitable transparent conductor.

The LEDs 320 may define different pixels in the display panel 300. For example, each LED 320 in FIG. 3 may represent a single color (e.g., red, green, or blue). As discussed in more detail below, the LEDs 320 emit light when current flows through them. That is, when current flows between the LEDs 320 and the cathode layer 315. The LEDs 320 are controlled by logic in the TFT layers 325 which can include various transistors, gate lines, sources line, capacitors, and a high voltage rail (VDD) which are disposed on a TFT substrate 330. Unlike the cathode layer 315 and the encapsulation layer 310, the TFT layers 325 and TFT substrate 330 may not be optically transparent.

In this embodiment, the capacitive sensor 305 is disposed on the layers forming the display portion of the LED display panel 300. Specifically, the capacitive sensor 305 contacts the encapsulation layer 310 which electrically insulates sensor electrodes in the capacitive sensor 305 from the conductive cathode layer 315. In this embodiment, the capacitive sensor 305 is a discreet sensor which is separate from the layers forming the display. That is, none of the sensor electrodes used to perform capacitive sensing are also used for updating the display. Put differently, the capacitive sensor is a discreet sensor or an on-cell sensor rather than an in-cell sensor where one or more electrodes used for capacitive sensing are also used for updating the display. Moreover, the capacitive sensor 305 is substantially transparent so that the light emitted by the LEDs 320 can be seen at a top surface 340 of the display panel 300. In one embodiment, the sensor electrodes in the capacitive sensor 305 may be formed from ITO.

Although the encapsulation layer 310 prevents direct electrical connection between the capacitive sensor 305 and the cathode layer 315, FIG. 3 illustrates a capacitive coupling 335 between the capacitive sensor 305 and the cathode layer 315. This capacitive coupling 335 is not a discreet capacitor but rather is formed inherently because of the close proximity of the conductive material in the cathode layer 315 and the conductive material in the capacitive sensor 305. Although in display panel 300 the cathode layer 315 is capacitively coupled to the capacitive sensor 305, the embodiments herein are not limited to such. In other LED display panels a different transparent conductive layer (e.g., an anode layer) may be formed closest to the discreet capacitive sensor 305, in which case that layer may be capacitively coupled to the capacitive sensor 305 as shown in FIG. 3.

As a result of the capacitive coupling 335, voltage changes on the cathode layer 315 affect the voltages on the capacitive sensor 305 which in turn can affect the capacitive sensing signals measured by the sensor 305. Put differently, the current flowing in the cathode layer 315 as a result of operating the LED display can cause noise or interference on the capacitive sensor 305 because of the capacitive coupling 335. Thus, if the capacitive sensor 305 acquires capacitive sensing signals at the same time current is flowing through the cathode layer 315, the cathode layer 315 can introduce noise or interference in these signals. Although a cathode layer 315 is shown in FIG. 3, the discussion and structure above also apply when the cathode layer 315 is replaced with an anode layer.

Figure 4A:
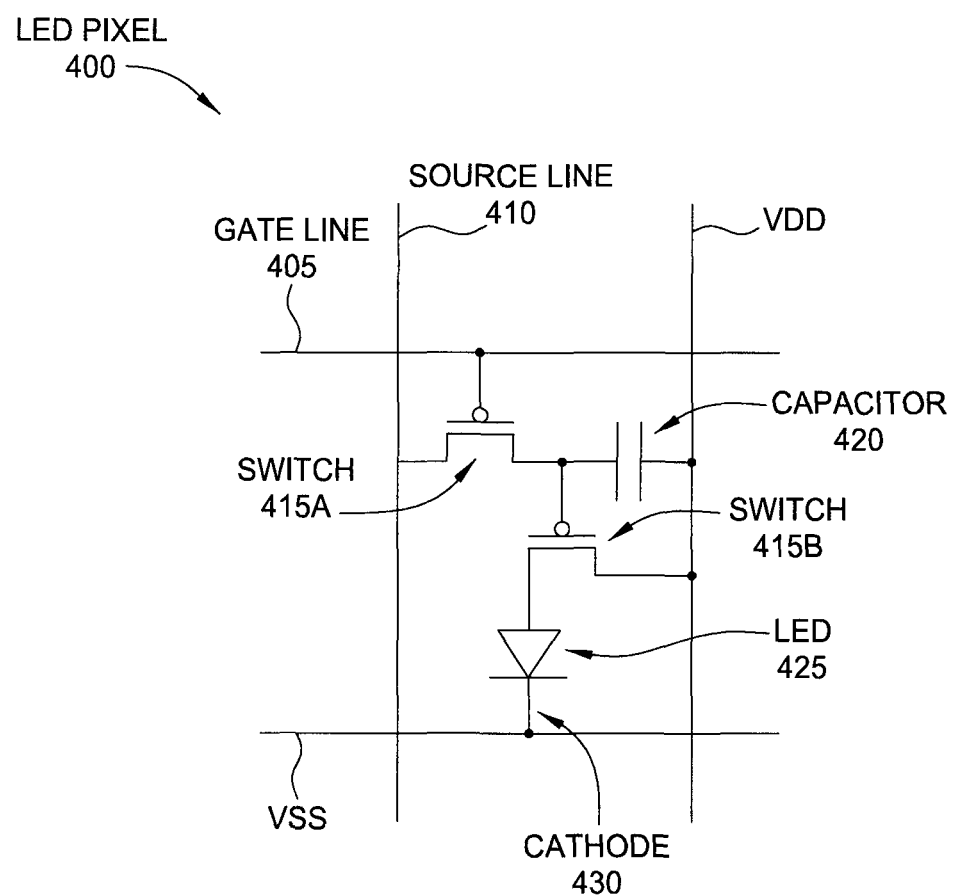
FIG. 4A illustrates a display pixel with a cathode layer in accordance with an embodiment described herein.

FIG. 4A illustrates an LED pixel 400 in accordance with an embodiment described herein. The pixel 400 includes a gate line 405, a source line 410, a first switch 415A, a second switch 415B, a capacitor 420, and an LED 425. The first switch 415A is activated (e.g., turned on and off) by the gate line 405. When activated, the first switch 415A couples a first end of the capacitor 420 to the source 410 while a second end of the capacitor 420 is coupled to VDD which charges the capacitor. Moreover, the voltage at the first end of the capacitor 420 controls the gate of the second switch 415B which determines whether the switch 415B couples the LED to VDD. In this example, the source line 410 can set the voltage across the capacitor 420 to control how much current flows through the second switch 415B, and thus, how much current flows through the LED 425. By decreasing the voltage across the capacitor 420, the conductive channel in the second switch 415B is reduced thereby limiting the current flowing through the LED 425, and thus, the brightness of the LED 425.

In one embodiment, the LED display panel periodically updates the voltage across the capacitor 420 to either compensate for charge leakage or to display a different image. Unlike with a liquid crystal display (LCD), the LED pixel 400 emits light only when current flows through the LED 425. Specifically, current flows between VDD and VSS at the cathode 430 which can be coupled to the cathode layer 315 shown in FIG. 3. In another embodiment, the cathode 430 is part of the cathode layer 315. Thus, any time the LED 425 is emitting light, the LED pixel 400 generates a current in the cathode 430. As described above, this current can cause interference in a capacitive sensor proximate to the cathode layer. In one embodiment, the processing system which acquires and processes the capacitive sensing signal does know the amount of interference caused by the cathode 430 in the LED pixels 400. For example, the interference may change depending on the amount of current flowing through the cathode 430 at any given time. The current in the cathode 430 may fluctuate based on any number of factors such as the particular image being displayed or based on the brightness of the display.

Although it is possible for the processing system to receive information from the display controller which can be used to estimate the current in the cathode 430 (and in the cathode layer 315 as whole), and in turn, estimate the interference at the capacitive sensor, this may be expensive and require complex circuitry. Instead, the embodiments herein describe measuring an electrical characteristic of the cathode layer (e.g., a charge, current, or voltage) to derive the interference caused by the cathode layer on the capacitive sensor.

The LED pixel 400 in FIG. 4A is just one example of a suitable LED pixel. The embodiments herein can be used by any LED pixel which has a conductive layer capacitively coupled to a capacitive sensor. For example, instead of using the second switch 415B to control the brightness of the LED 425, other LED display panels may control the number of rows in a display that are activated thereby controlling the overall brightness of the LED panel. For example, only two thirds of rows of pixels may be activated, thereby decreasing the brightness by 33%. Regardless of the driving scheme of the LED pixel 400, the capacitive sensing system may not know the interference caused by driving the LED pixels 400, and thus, can use the embodiments herein to measure that interference. Further, FIG. 4A illustrates using two transistors to control the LED pixel 400, but in other embodiments the pixel may include more transistors (e.g., 8-12 transistors) for compensating for variations in the LED display.

Figure 4B:
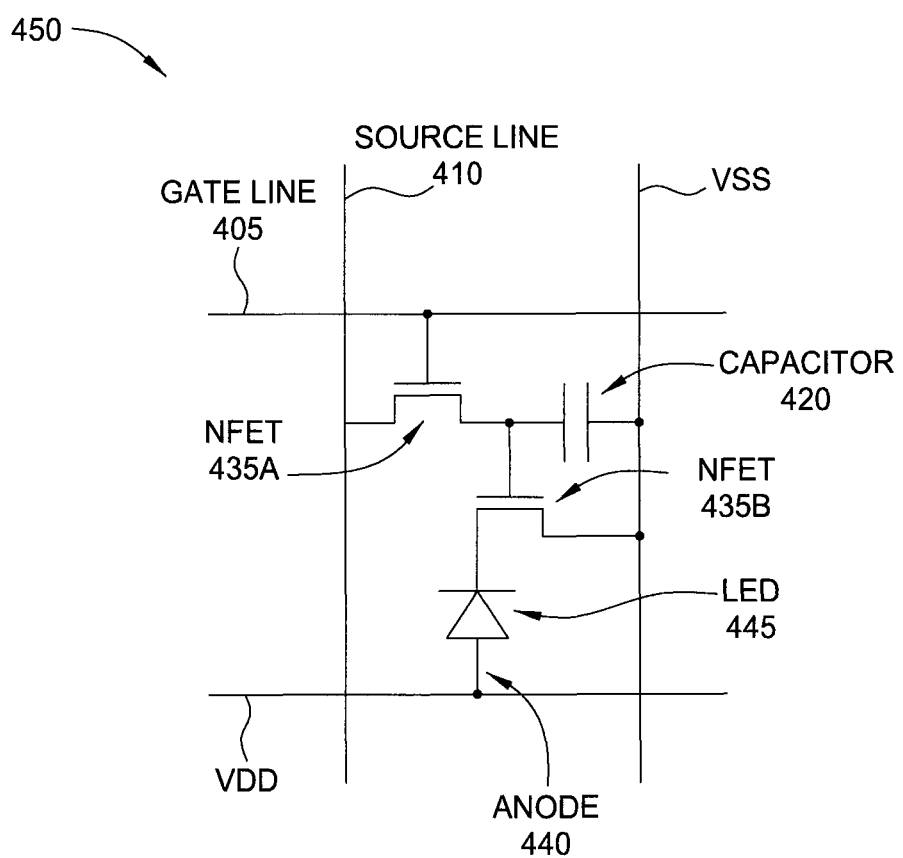
FIG. 4B illustrates a display pixel with an anode layer in accordance with an embodiment described herein.

FIG. 4B illustrates a display pixel 450 with an anode layer in accordance with an embodiment described herein. The pixel 450 includes the gate line 405 and source line 410 in a similar arrangement as that shown in FIG. 4A. However, instead of using pFETs as the switches, the pixel 450 includes first and second nFETs 435A and 435B for selectively coupling the capacitor 420 and an LED 445 to the gate line 405 and the source line 410. Moreover, the voltage rails VSS and VDD are switched in FIG. 4B relative to the arrangement in FIG. 4A.

Instead of being coupled to a cathode, the LED 445 is coupled to an anode 440. In this embodiment the LED 445 (or OLED) is a bottom emission type and the anode 440 of the LED 445 is part of the common conductive surface—e.g., an anode layer. Thus, FIGS. 4A and 4B illustrate that an LED pixel can be coupled to either a cathode layer or anode layer (referred to generally as a transparent conductive layer) which can be used to measure interference generated by the LED display.

Figure 5:
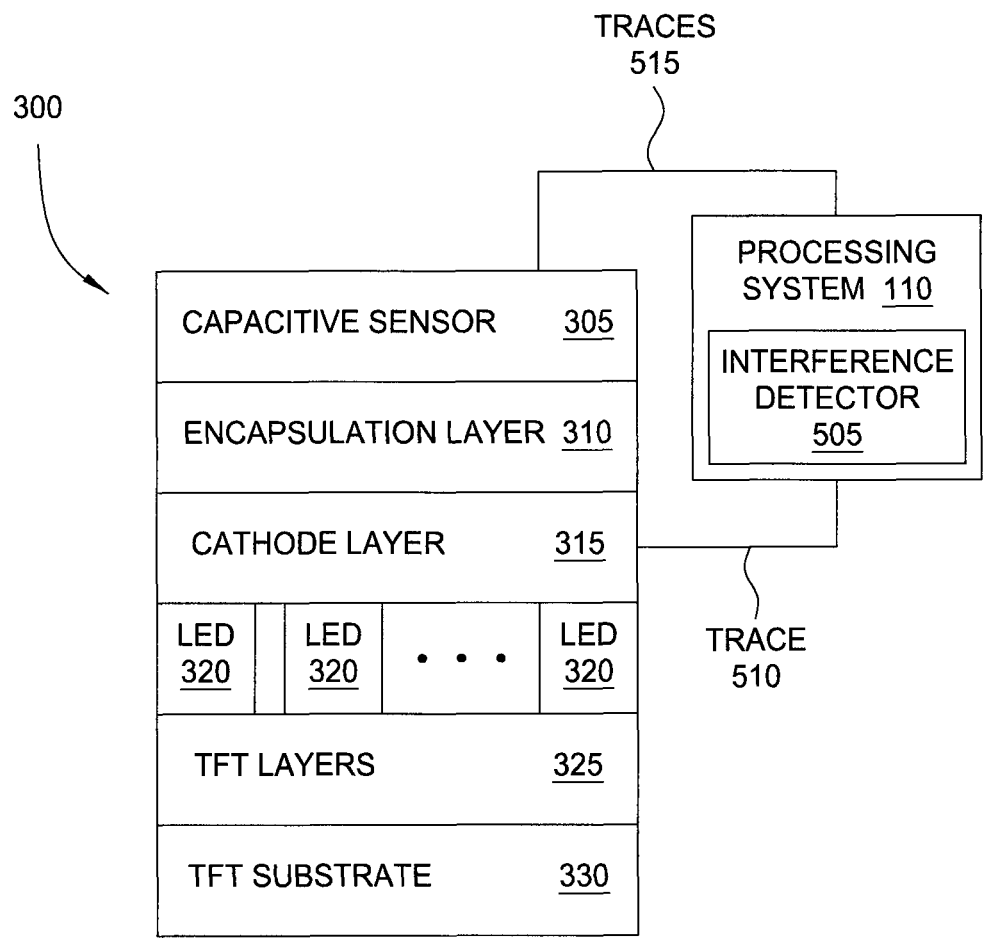
FIG. 5 illustrates a display panel for measuring interference from a cathode layer in accordance with an embodiment described herein.

FIG. 5 illustrates a display panel 300 for measuring interference caused by the cathode layer 315 in accordance with an embodiment described herein. The display panel 300 includes the same layers in a vertical stack as shown in FIG. 3. However, in FIG. 5, the cathode layer 315 is coupled via a trace 510 to an interference detector 505 in the processing system 110. The interference detector 505 acquires electrical measurements corresponding to the cathode layer 315. For example, the interference detector 505 may determine the current, voltage, charge, or changes thereof in the cathode layer 315 caused by driving the LEDs 320 as described above. Although FIG. 5 illustrates coupling the cathode layer 315 to the trace 510, in another embodiment, whichever transparent conductive layer in the LED display that is closest to the capacitive sensor 305 (and thus, may be the most capacitively coupled to the sensor 305) is coupled to the trace 510 and the interference detector 505.

The capacitive sensor 305 is coupled to the processing system 110 via traces 515. In one embodiment, the processing system 110 includes a sensor module which includes circuitry for acquiring capacitive sensing measurements from sensor electrodes in the capacitive sensor 305. In one embodiment, the sensor module may include respective analog front end (AFE) channels for receiver electrodes in the capacitive sensor 305. The AFE channels may include receivers and analog to digital converters (ADCs) for generating digital capacitive sensing measurements. The processing system 110 may process these digital measurements to identify a location on the display panel where an input object (e.g., a finger or stylus) is contacting or hovering over. In other embodiments, the digital measurements may be transmitted to a different processing system, e.g., a host processor or an operating system, for processing.

In one embodiment, the sensor module in the processing system 110 acquires capacitive sensing measurements at the same time the interference detector 505 measures an electrical characteristic of the cathode layer 315. For example, the sensor module in the processing system 110 may actively acquire capacitive sensing signals from the capacitive sensor 305 at the same time a receiver in the interference detector 305 acquires an interference measurement from the cathode layer 315. Put differently, the sensor module may be synchronized with the interference detector 505. As such, the interference measurement represents the interference caused by the cathode layer 315 on the capacitive sensor 305 when the capacitive sensing signals are being measured by the processing system 110.

Figure 6:
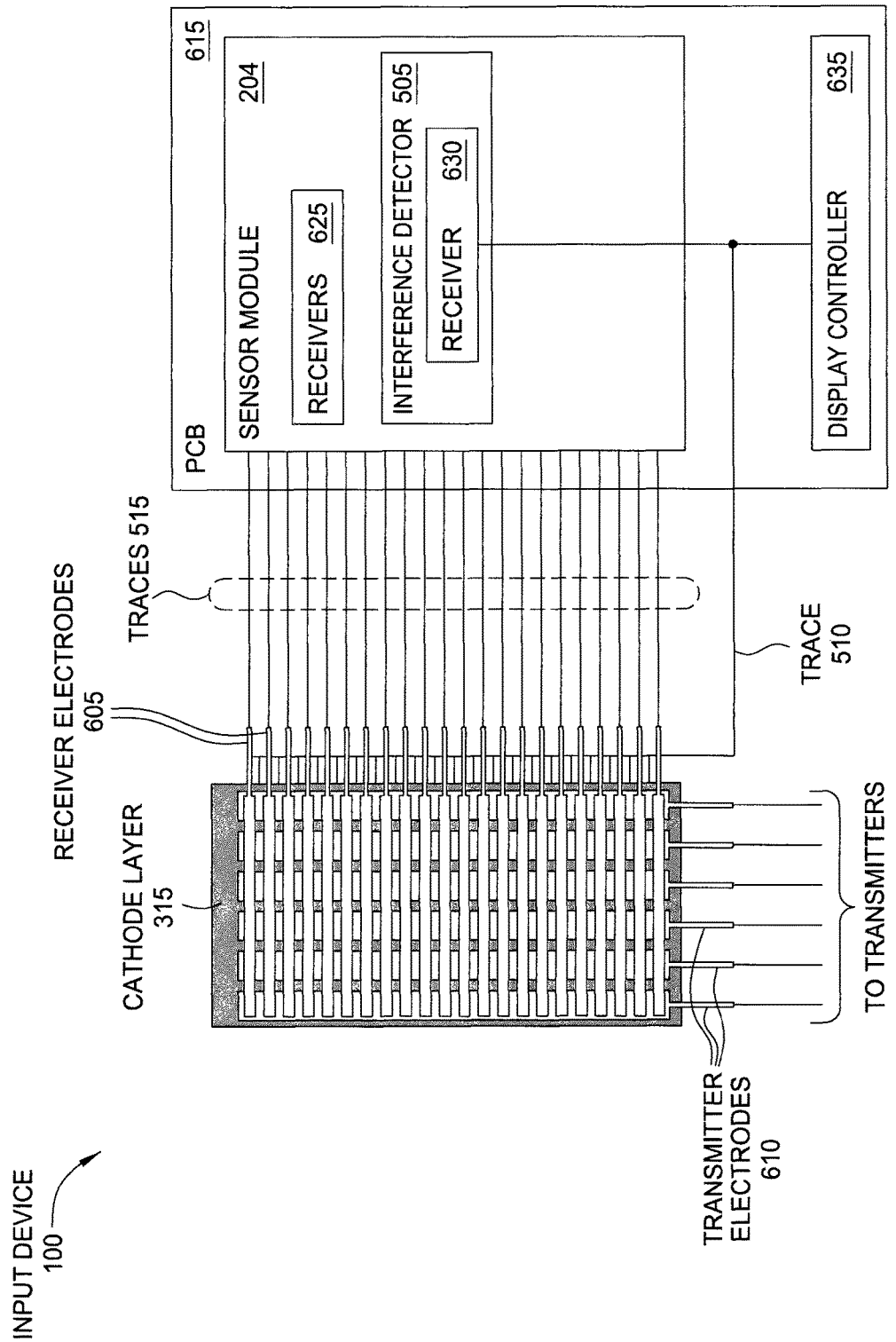
FIG. 6 illustrates an input device for measuring interference from a cathode layer in accordance with an embodiment described herein.

FIG. 6 illustrates an input device 100 for measuring interference caused by the cathode layer 315 in accordance with an embodiment described herein. In FIG. 6, the capacitive sensor includes a plurality of transmitter electrodes 610 that are overlapped by a plurality of receiver electrodes 605. Moreover, the transmitter electrodes 610 extend in a first direction while the receiver electrodes 605 extend in a second direction perpendicular to the first direction. Although shown as being perpendicular, the transmitter electrodes 610 and receiver electrodes 605 may intersect at different angles. Each intersection of the transmitter and receiver electrodes may form a capacitive pixel that can be used to identify a location of an input object in the sensing region. For clarity, the other layers that may be in the display stack underneath the cathode layer 315 (e.g., the LEDs, gate lines, source lines, TFT layers, etc.) are not shown. Moreover, there may be addition layers disposed above the transmitter and receiver electrodes such as a glass cover.

As shown, the receiver electrodes 605 are each coupled to the sensor module 204 via a respective trace 515. In one embodiment, each of the traces 515 is coupled to a respective receiver 625 either directly or via a multiplexer (i.e., multiple receiver electrodes 605 may share the same receiver 625). Generally, each receiver 625 can be considered as a respective AFE channel. To perform capacitive sensing, in this embodiment, the transmitter electrodes 610 are coupled to respective transmitters. Although not shown, the transmitters may also be disposed on the sensor module 204 or some other portion of the processing system. Driving the transmitting signals on the transmitter electrodes 610 cause resulting signal on the receiver electrodes 605 which are measured by the receivers 625. The receivers 625 can generate capacitive sensing measurements which can be processed by the sensor module 204 or other logic in the processing system or host processor. Although a mutual capacitance (or transcapacitance) system is shown, in other embodiments, the capacitive sensor may include sensor electrodes for performing self capacitance (or absolute capacitance) sensing. That is, interference from the cathode layer 315 can affect capacitive sensing signals measured using either capacitive sensing technique.

Like in FIG. 5, the cathode layer 315 is coupled via the trace 510 to the interference detector 505, which in this embodiment, is located in the sensor module 204. More specifically, the trace 510 is coupled to a receiver 630 in the interference detector 505 which may be similar to or the same as the receivers 625 coupled to the receiver electrodes 605. In addition to coupling the cathode layer 315 to the interference detector 505, the trace 510 also couples the cathode layer to the display controller 635 which updates the image displayed in the input device 100. In one embodiment, the sensor module 204 is disposed on a different integrated circuit than the display controller 635. However, in another embodiment, the sensor module 204 and the display controller 635 are in the same integrated circuit.

The trace 510 extends onto a printed circuit board (PCB) 615 on which the sensor module 204 and the display controller 635 are disposed. In one embodiment, the PCB 615 is a flex PCB. In order for current to flow through the LEDs, the cathode layer 315 has a connection to a reference voltage—e.g., VSS. The connection to the reference voltage may be provided by the trace 510. Although the trace 510 is coupled to the display controller 635, in other embodiment, the trace 510 is coupled to a power module (e.g., a power chip).

In FIG. 6, the trace 510 is dual purposed to couple the cathode layer 315 to the reference voltage and to couple the cathode layer 315 to the interference detector 505. Thus, instead of adding a new trace in order to couple the cathode layer 315 to the interference detector 505, the trace 510 can be extended on the PCB 615 to couple the cathode layer 315 to the interference detector 505, thereby avoiding multiple traces coupled to the cathode layer 315. However, in another embodiment, the PCB may include two different traces coupled to the cathode layer 315: one trace coupled to the interference detector and a second trace coupled to the display controller 635.

In FIG. 6, the trace 510 forms a direct (i.e., DC) contact with the receiver 630 in the interference detector 505. However, in another embodiment, the trace 510 is indirectly (i.e., AC) coupled to the receiver 630. In that example, the PCB 615 or the interference detector 505 may include a capacitor disposed between the receiver 630 and the trace 510 where one end of the capacitor is coupled to the trace 510 and the other end is coupled to the receiver 630. AC coupling the receiver 630 to the trace 510 (and to the cathode layer 315) may mitigate any effect the receiver 630 has on the current flowing in trace 510. Stated differently, AC coupling the receiver 630 to the trace 510 may prevent the receiver 630 from negatively affecting display updating being performed by the display controller 635.

Figure 7A:
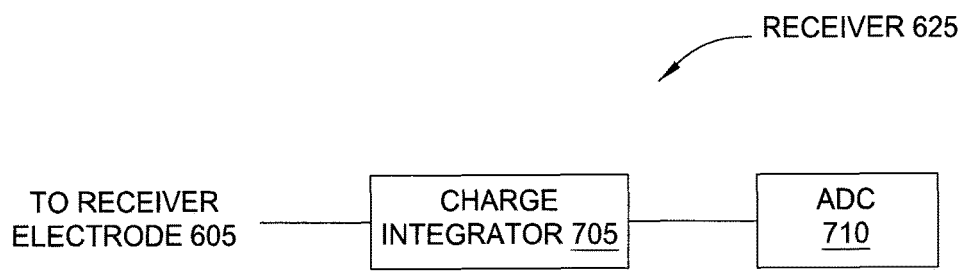
FIGS. 7A and 7B are block diagrams of receivers in accordance with embodiments described herein.
Figure 7B:
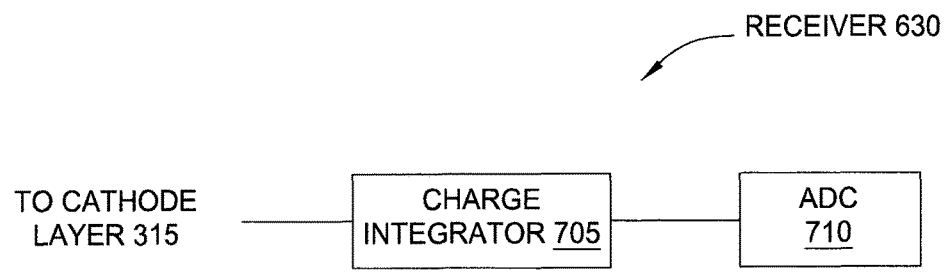

FIGS. 7A and 7B are block diagrams of receivers in accordance with embodiments described herein. FIG. 7A illustrates one example of the receiver 625 shown in FIG. 6 which is used to measure capacitive sensing signals on sensor electrodes—e.g., the receiver electrodes 605. The receiver 625 includes a charge integrator 705 which measures a change in charge on the receiver electrodes 605 in response to driving a transmitter signal on the transmitter electrodes. This change in charge varies when an input object is proximate to a capacitive pixel where the receiver electrode 605 intersects with a transmitter electrode 610.

In one embodiment, the charge integrator 705 may include an operational amplifier coupled to the receiver electrode 605 (via a trace). Moreover, the operational amplifier may include a capacitor and a reset switch in respective feedback loops coupling the output of the operational amplifier to one of its input, thereby forming an integrator. The output of the charge integrator 705 is coupled to an ADC 710 which converts the analog output of the charge integrator 705 into a digital capacitive sensing measurement. By processing the digital measurements, the processing system can identify a location of an input object.

In other embodiments, instead of detecting a change in charge, the receiver 625 may measure changes in other electrical characteristics of the receiver electrode 605 such as changes in current. Further still, instead of being used to perform transcapacitive sensing, the receiver 625 can be modified to perform absolute capacitive sensing.

FIG. 7B illustrates one example of the receiver 630 used to measure an electrical characteristic of the cathode layer 315 in order to determine a measurement of interference. Like receiver 625, the receiver 630 includes the charge integrator 705 which may include an operational amplifier with a feedback capacitor. The output of the charge integrator 705 is coupled to an ADC 710 which outputs a digital measurement of interference. As described below, the measurement of interference can affect how the processing system processes the capacitive sensing measurements generated by the receiver 625.

In other embodiments, instead of detecting a change in charge, the receiver 630 may measure changes in other electrical characteristics of the cathode layer 315 such as changes in current.

Figure 8:
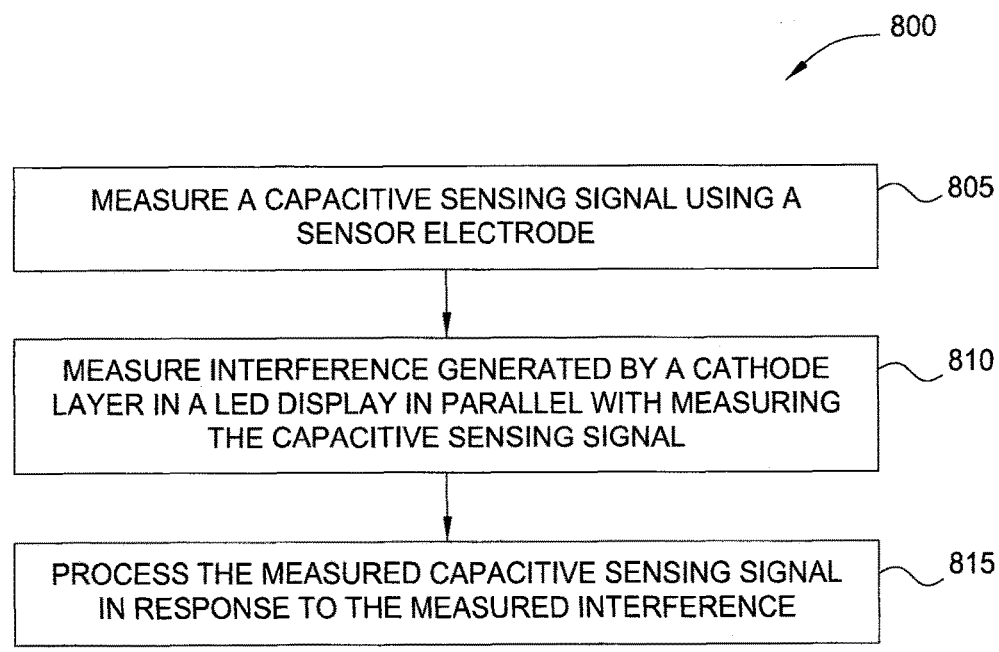
FIG. 8 is a flowchart for performing capacitive sensing in the presence of interference from a cathode layer in accordance with an embodiment described herein.

FIG. 8 is a flowchart of a method 800 for performing capacitive sensing in the presence of interference from a cathode layer in accordance with an embodiment described herein. At block 805, the processing system measures a capacitive sensing signal using a sensor electrode. In one embodiment, the sensor electrode is part of a capacitive sensor that is disposed on an LED display panel. That is, the capacitive sensor and the LED display panel may form a display stack that is able to both perform capacitive sensing and display images to a user. In one embodiment, the capacitive sensor establishes a sensing region that includes, at least in part, the image displayed by the LED display. The capacitive sensor may be disposed between the LED display and a glass cover for enclosing and protecting the LED display panel. As such, the capacitive sensor is optically transparent so that the image generated by the LED display is visible to a user viewing the glass cover.

In one embodiment, the sensor electrode is part of a discreet sensor where none of the sensor electrodes used to perform capacitive sensing are used to perform display updating. However, in another embodiment, the capacitive sensor may include common electrodes that are used for display updating and for capacitive sensing. One advantage of combining a discreet capacitive sensor with an LED display is that capacitive sensing does not need to be synchronized with display updating. Because the sensor electrodes are not used for display updating, capacitive sensing can be performed regardless whether the display controller is currently displaying an image. Nonetheless, as described above, a conductive layer in the LED display panel that is closest to the capacitive sensor (e.g., the cathode layer) may be capacitively coupled to the capacitive sensor such that updating the display or displaying an image can cause interference in the capacitive sensing signals. In one example, when an LED is emitting light, current flows through the LED and into the cathode layer. If the capacitive sensor is performing capacitive sensing at the same time, the current in the cathode layer can cause interference or noise in the capacitive sensing signals.

At block 810, the processing system measures interference generated by the cathode layer in the LED display in parallel with measuring the capacitive sensing signal at block 805. Although the cathode layer is specifically mentioned, the embodiments herein are not limited to such. For example, the processing system may measure interference from one, two, or more different conductive layers in the LED display. Furthermore, the processing system may measure interference caused by the conductive layer in the LED display that is closest to the sensor electrodes in the capacitive sensor which may, or may not, be the cathode layer.

In one embodiment, the processing system includes an interference detector that includes a dedicated receiver for measuring interference generated by the cathode layer. That is, the processing system may use a different receiver for measuring the interference generated by the cathode layer than the receivers used for performing capacitive sensing. Although the processing system may include separate receivers, the structure and components of those receivers may be the same or different. Moreover, the interference detector may be disposed on the same integrated circuit or a different integrated circuit from the receivers used for capacitive sensing.

At block 815, the processing system processes the measured capacitive sensing signal in response to the measured interference. In one embodiment, the processing system compares the measured interference to a noise threshold to determine whether to process the capacitive sensing signals measured at the same time. For example, the processing system may compare one of more interference measurements (or an average thereof) to the noise threshold. If the interfere measurement is above the noise threshold, the processing system may deem the system is too noisy and discard (or ignore) the capacitive sensing measurements captured in parallel. However, if below the noise threshold, the processing system proceeds to process the capacitive sensing measurements. In one embodiment, the interference measurements can be used to determine whether to keep or discard the capacitive sensing measurements before the measurements are processed by the ADC or after the measurements have been converted into corresponding digital measurements.

In another embodiment, the processing system uses the interference measurements for digital or hardware filtering in a temporal or spatial manner. The filtering can mitigate the effect of the interference on the capacitive sensing measurements. When performing spatial filtering, the processing system can perform common noise removal based on the assumption that the cathode current affects the receiver electrodes substantially equally. When performing temporal filtering, the processing system can disseminate the capacitive sensing measurements (or samples) or perform stronger or lighter filtering of those samples. Moreover, the processing system may use a combination of the binary filtering (e.g., determining if the interference measurements are above or below a noise threshold) and digital or hardware filtering in order to process the capacitive sensing measurement in response to the interference measurements of the cathode layer.

The embodiments and examples set forth herein were presented in order to best explain the embodiments in accordance with the present technology and its particular application and to thereby enable those skilled in the art to make and use the present technology. However, those skilled in the art will recognize that the foregoing description and examples have been presented for the purposes of illustration and example only. The description as set forth is not intended to be exhaustive or to limit the disclosure to the precise form disclosed.

In view of the foregoing, the scope of the present disclosure is determined by the claims that follow.

We claim:

1. An input device, comprising:
   a light emitting diode (LED) display comprising a transparent conductive layer that is one of a cathode layer and an anode layer;
   a plurality of sensor electrodes disposed on the LED display, wherein the plurality of sensor electrodes establishes a sensing region of the input device; and
   a processing system configured to:
      determine, using a first receiver, a capacitive sensing signal generated using at least one of the plurality of sensor electrodes;
      determine, using a second receiver, interference generated by the LED display in parallel with determining the capacitive sensing signal using the first receiver, wherein the second receiver is electrically coupled to the transparent conductive layer in the LED display; and
      process the capacitive sensing signal in response to the determined interference.

2. The input device of claim 1, further comprising:
   a discreet capacitive sensor comprising the plurality of sensor electrodes, wherein the discreet capacitive sensor is disposed in a vertical stack with the LED display and is separated from the transparent conductive layer by a dielectric layer.

3. The input device of claim 2, wherein the discreet capacitive sensor includes transmitter electrodes and receiver electrodes, wherein the transmitter electrodes extend in a first direction different from a second direction in which the receiver electrodes extend.

4. The input device of claim 3, wherein the receiver electrodes are coupled to a plurality of receivers that includes the first receiver, wherein determining the interference using the second receiver is performed in parallel with determining respective capacitive sensing signals using the plurality of receivers.

5. The input device of claim 1, wherein the transparent conductive layer is coupled to respective LED diodes in the LED display.

6. The input device of claim 1, further comprising:
   a trace disposed on a printed circuit board (PCB), wherein the trace couples the second receiver to the cathode layer.

7. The input device of claim 6, wherein the second receiver is directly coupled to the trace.

8. The input device of claim 6, wherein the second receiver is capacitively coupled to the trace.

9. The input device of claim 6, wherein the first receiver and the second receiver are disposed on the PCB.

10. A processing system, comprising:
    a first receiver configured to couple to a first sensor electrode of a plurality of sensor electrodes establishing a sensing region of an input device, wherein the first receiver is configured to determine a capacitive sensing signal generated using the first sensor electrode; and a second receiver configured to electrically couple to a transparent conductive layer in an LED display, wherein the plurality of sensor electrodes are disposed on the LED display, and wherein the second receiver is configured to determine interference generated by the LED display using the transparent conductive layer in parallel with determining the capacitive sensing signal using the first receiver.

11. The processing system of claim 10, wherein the plurality of sensor electrodes are part of a discreet capacitive sensor disposed in a vertical stack with the LED display and is separated from the transparent conductive layer by a dielectric layer.

12. The processing system of claim 11, wherein the discreet capacitive sensor includes transmitter electrodes and receiver electrodes, wherein the transmitter electrodes extend in a first direction perpendicular to a second direction in which the receiver electrodes extend.

13. The processing system of claim 12, further comprising:
a plurality of receivers coupled to the receiver electrodes, wherein the plurality of receivers includes the first receiver, and wherein determining the interference using the second receiver is performed in parallel with determining respective capacitive sensing signals using the plurality of receivers.

14. The processing system of claim 10, wherein the second receiver is configured to be directly coupled to a trace in order to couple to the transparent conductive layer.

15. The processing system of claim 10, wherein the second receiver is configured to be AC coupled to a trace in order to couple to the transparent conductive layer.

16. A method, comprising:
determining, using a first receiver, a capacitive sensing signal generated using a first sensor electrode of a plurality of sensor electrodes, wherein the plurality of sensor electrodes establishes a sensing region of an input device;
determining, using a second receiver, interference generated by an LED display in parallel with determining the capacitive sensing signal using the first receiver, wherein the plurality of sensor electrodes is disposed on the LED display, and wherein the second receiver is electrically coupled to a transparent conductive layer in the LED display; and
processing the capacitive sensing signal in response to the determined interference.

17. The method of claim 16, further comprising:
determining, using a third receiver, a capacitive sensing signal generated using a second sensor electrode of the plurality of sensor electrodes in parallel with both determining the capacitive sensing signal using the first receiver and determining the interference using the second receiver.

18. The method of claim 16, wherein determining the capacitive sensing signal using the first receiver comprises:
receiving the capacitive sensing signal from a receiver electrode in response to a transmitter electrode transmitting a modulated signal, wherein the receiver electrode extends in a first direction perpendicular to a second direction on which the transmitter electrode extends.

19. The method of claim 16, wherein the transparent conductive layer is capacitively coupled to the first sensor electrode, wherein an dielectric encapsulation layer is disposed between the first sensor electrode and the transparent conductive layer.

20. The method of claim 16, wherein the transparent conductive layer is part of a cathode layer in the LED display, wherein the cathode layer is coupled to respective LED diodes in the LED display.

* * * * *